US007642783B2

(12) United States Patent
Freytag

(10) Patent No.: US 7,642,783 B2
(45) Date of Patent: Jan. 5, 2010

(54) NMR PROBEHEAD WITH A PLURALITY OF RESONATOR SYSTEMS FOR SIMULTANEOUS MEASUREMENT OF A PLURALITY OF SAMPLES IN A COUPLED MODE

(75) Inventor: Nicolas Freytag, Binz (CH)

(73) Assignee: Bruker Biospin AG, Faellanden (CH)

( * ) Notice: Subject to any disclaimer, the term of this patent is extended or adjusted under 35 U.S.C. 154(b) by 0 days.

(21) Appl. No.: 12/285,202

(22) Filed: Sep. 30, 2008

(65) Prior Publication Data

US 2009/0102482 A1  Apr. 23, 2009

(30) Foreign Application Priority Data

Oct. 17, 2007 (DE) ............ 10 2007 049 701

(51) Int. Cl.
*G01V 3/00* (2006.01)
(52) U.S. Cl. .................... 324/322; 324/321
(58) Field of Classification Search ......... 324/300–322; 600/410–435; 333/219–235; 343/741–744, 343/893

See application file for complete search history.

(56) References Cited

U.S. PATENT DOCUMENTS

| | | | |
|---|---|---|---|
| 4,654,592 A | 3/1987 | Zens | |
| 5,003,265 A | 3/1991 | Leussler | |
| 5,045,793 A | 9/1991 | Rathke | |
| 5,574,370 A | 11/1996 | Woelk | |
| 6,456,072 B1 * | 9/2002 | Webb et al. | 324/308 |
| 6,677,751 B1 * | 1/2004 | Marek et al. | 324/318 |
| 6,788,064 B2 | 9/2004 | Gerald | |
| 6,794,868 B1 | 9/2004 | Wong | |
| 6,917,201 B2 | 7/2005 | de Swiet | |
| 7,068,034 B2 | 6/2006 | de Swiet | |
| 2004/0164738 A1 | 8/2004 | Raftery | |
| 2005/0253587 A1 | 11/2005 | Peck | |
| 2006/0164088 A1 | 7/2006 | Hawkes | |

OTHER PUBLICATIONS

Edward J. Butterworth and John C. Gore, "Computing the $B_1$ field of the toroidal MRI coil". Journal of Magnetic Resonance 175 (2005) 114-123.
Nadia Benabdallah, Nasreddine Benahmed, Boumediene Benyoucef, Rachid Bouhmidi and M'Hamed Khelif, "Electromagnetic analysis of the slotted-tube resonator with a circular cross section for MRI applications". Phys. Med. Biol. 52 (2007) 4943-4952.

* cited by examiner

*Primary Examiner*—Brij B Shrivastav
*Assistant Examiner*—Dixomara Vargas
(74) *Attorney, Agent, or Firm*—Paul Vincent

(57) ABSTRACT

A nuclear magnetic resonance(=NMR) probehead, comprising N basic elements (10a, 10b, 10c), where N≧2, wherein each basic element (10a, 10b, 10c) comprises a measurement sample (11) and a resonator system (12a, 12b, 12c), and wherein the N resonator systems (12a, 12b, 12c) of the N basic elements (10a, 10b, 10c) are coupled to each other, is characterized in that a coupling network for the N resonator systems (12a, 12b, 12c) is provided, with which the totality of the N resonator systems (12a, 12b, 12c) can be operated in one identical, coupled mode during transmission and reception, wherein the coupling network comprises a shared receiver circuit for the totality of the N resonator systems (12a, 12b, 12c). With the inventive NMR probehead, a better signal-to-noise ratio can be achieved in the case of lossy samples than with probeheads according to the prior art.

14 Claims, 8 Drawing Sheets

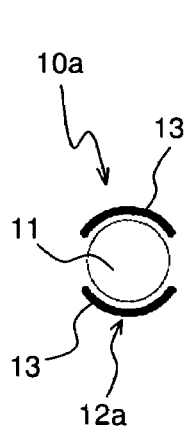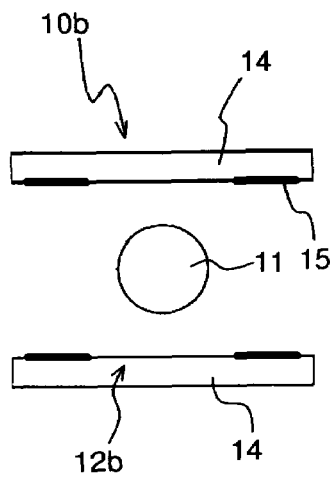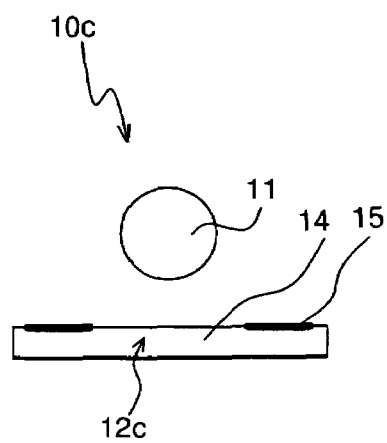
Fig. 1a        Fig. 1b        Fig. 1c
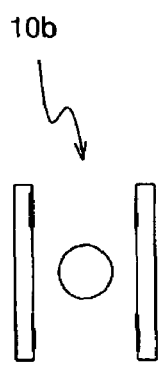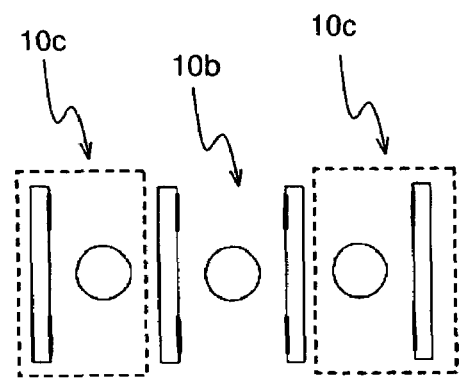
Fig. 2a        Fig. 2b

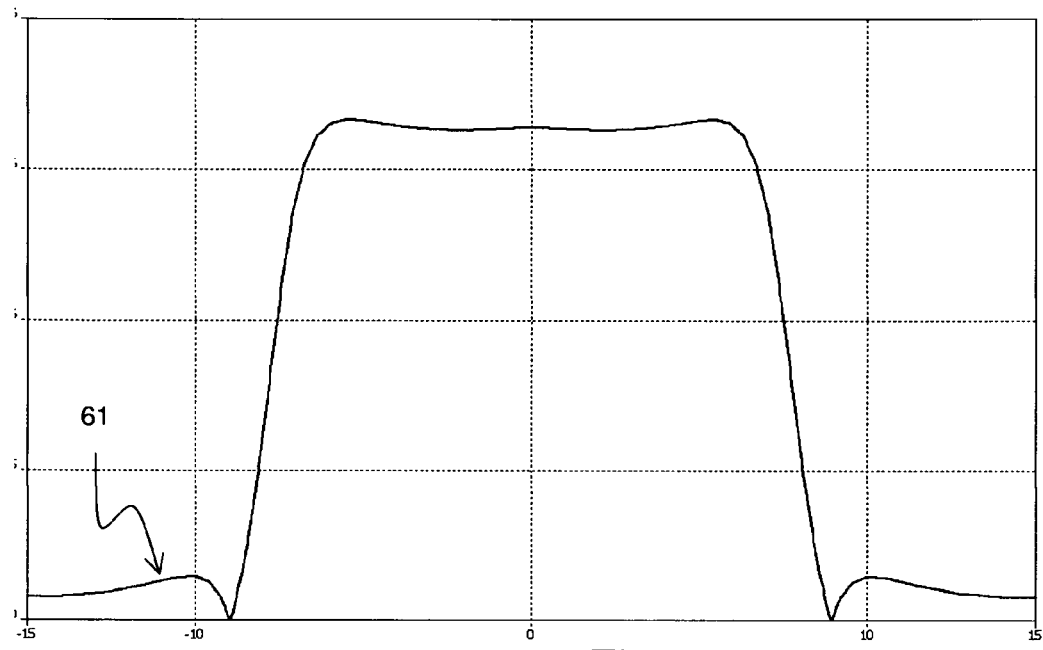
Fig. 6a
Fig. 6b
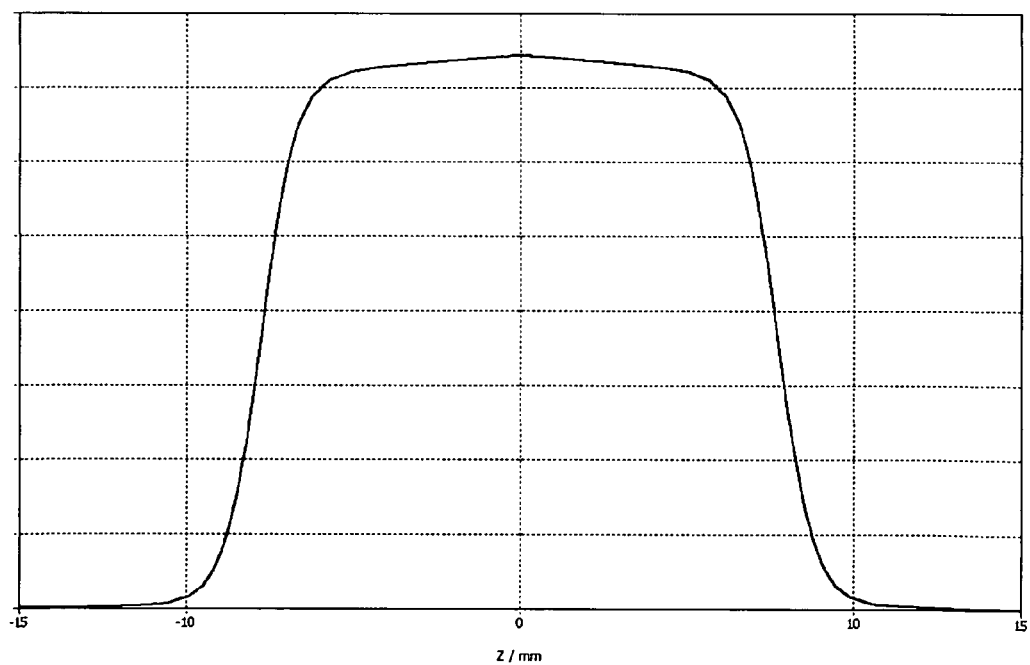

NMR PROBEHEAD WITH A PLURALITY OF RESONATOR SYSTEMS FOR SIMULTANEOUS MEASUREMENT OF A PLURALITY OF SAMPLES IN A COUPLED MODE

This application claims Paris Convention priority of DE 10 2007 049 701.8 filed Oct. 17, 2007 the complete disclosure of which is hereby incorporated by reference.

BACKGROUND OF THE INVENTION

The invention concerns a nuclear magnetic resonance (=NMR) probehead, comprising N basic elements, where $N \geq 2$, wherein each basic element comprises a measurement sample and a resonator system, and wherein the N resonator systems of the N basic elements are coupled to each other.

Such an NMR probehead is known, for example, from US 2006/0164088 A1, according to US 2006164088.

NMR spectroscopy is a powerful method of instrumental analysis. Radio-frequency (RF) pulses are radiated into a sample to be examined, which is located in a strong, static magnetic field $B_0$, and the reaction of the sample is measured. The chemical bond relationships in the probe can be inferred from the position and intensity of NMR lines.

The RF radiation is transmitted and received by means of RF resonators. The RF resonators are located in the immediate vicinity of the sample or the sample is located inside the RF resonators.

The quality of NMR measurement depends on the signal-to-noise ratio (SNR) that can be achieved. The SNR depends, among other factors, on the RF resonators used. A number of measures are known by which a good SNR can be achieved:

Especially high filling factors can be achieved by the use of toroid resonators (see U.S. Pat. No. 5,045,793, U.S. Pat. No. 6,788,064, U.S. Pat. No. 5,574,370, and "Computing the B1 field of the toroidal MRI coil" Butterworth and Gore, J. Magn. Reson. 175, 114-123 (2005)). With toroid resonators, however, inhomogeneities of the static magnetic field cannot be fully compensated for by "shimming". Moreover, these resonators exhibit an extremely inhomogeneous RF field, so that the high filling factor cannot be utilized.

Furthermore, lossy samples often have to be measured; RF radiation is heavily absorbed, especially, by water or saline, acid or base solutions (which are often used as solvents for the substance to be measured). The SNR can then be improved by a sample that is thin in the direction of the electrical field (E-field) component of the RF radiation which is positioned in the region of the passage through zero of the E-field (see U.S. Pat. No. 7,068,034 and U.S. Pat. No. 6,917,201).

U.S. Pat. No. 5,003,265 discloses an NMR tomograph in which an RF coil has a plurality of consecutive, spaced, inductively coupled, ring-shaped resonators. The resonators together enclose a measurement volume to be imaged.

US 2004164738, WO 00 50924, U.S. Pat. No. 4,654,592, U.S. Pat. No. 6,456,072, US 2005253587, and US 2006164088 disclose that a plurality of measurement samples, each in a separate detection coil, can be placed in an NMR probehead. The samples are then measured individually. This method is intended to minimize the time for placing samples in the probehead and for field homogenization. In this case, the samples usually contain different substances to be measured and are analyzed separately.

The object of this invention is to present an NMR probehead, with which an improved SNR can be achieved with lossy samples.

SUMMARY OF THE INVENTION

This task is solved by an NMR probehead of the type stated in the introduction, characterized in that a coupling network for the N resonator systems is provided with which the totality of the N resonator systems can be operated in one identical coupled mode during transmission and reception, wherein the coupling network comprises a common receiver circuit for the totality of the N resonator systems.

The basic idea of the present invention is to permit simultaneous measurement of a plurality of identical measurement samples with the inventive probehead. A sample to be measured (that is, an available quantity of a substance to be measured) that is dissolved in a lossy solvent is distributed among multiple measurement samples for this purpose (The solvent is subject to RF losses that are due either to the solvent itself (in particular, in the case of polar-solvents such as water, methanol, etc. . . . ) or to electric conductivity (due to dissolved salts, acids, or bases)). This enables the individual measurement samples to be dimensioned smaller and therefore be better positioned in the probehead, in particular, in the region of an E-field minimum in each resonator system. The multiple measurement samples are then measured in a coupled resonator mode, whereby the sample, which was originally a single sample, can be measured in a single measuring operation (in particular, a single coupling and decoupling operation). In this case, the N basic elements, or rather the associated N resonator systems, form a resonator complex that is operated as a single unit and, in particular, read out with a common receiver circuit. The SNR for a sample measured in this way is clearly better than for measurement of the sample when this is kept in a single sample vessel in a single resonator system and not divided up.

This improvement is achieved as follows: If a sample is divided among N single measurements with 1/N of the substance to be measured and these are measured together, this is equivalent to N single measurements with one measurement sample (containing 1/N of the substance to be measured). An SNR gain of $\sqrt{N}$ is achieved over measurement of one single measurement sample (containing 1/N substance to be measured). Generally, however, a larger SNR gain would be achieved if the sample were measured as a single sample (containing all the substance to be measured). However, this does not apply in the case of samples in which the dielectric losses dominate in the SNR: The SNR is always constant in the case of heavily lossy cylindrical samples of the same length and different diameters because both the signal and the noise increase proportionally to $r^2$. This means that, in such a case, an additional quantity of substance to be measured does not result in an improvement of the SNR. Here, division of the sample (substance to be measured) into N measurement samples, which are measured together in a coupled mode, as envisaged with the inventive NMR probehead, is superior in terms of SNR.

If the number N of measurement samples is increased excessively for a constant total volume, the noise received from the measurement samples is reduced to such an extent that the condition that the noise of the measurement sample dominates in the total noise is no longer true as from a certain division and the SNR drops again. For each substance to be measured (or for each solvent), there is an optimum division $N_{opt}$, at which the maximum SNR is achieved. In the invention, N equals $N_{opt}$, in particular, N equals $N_{opt}$ for $H_2O$ with 100 to 200 mMol NaCl, is therefore preferred.

The structure and method of operation of the inventive NMR probehead is further explained below. One measurement sample and one assigned resonator system (usually surrounding the measurement sample or adjacent to the measurement sample) together form a basic element; the N basic elements are typically identical and arranged closely in a line (typically ring-shaped). Each measurement sample is optimally positioned for the resonator system assigned to it (in particular, in the E-field minimum and in the maximum of the magnetic field ($B_1$-field) or in the region of greatest homogeneity of the $B_1$-field of the RF-field). By coupling the N resonator systems, all N measurement samples can be measured together and under the same conditions. In particular, only one measurement signal, generated in common by all basic elements, is read out.

All N resonator systems are operated together and with the same parameters. Preferably (but not necessarily), the resonator systems are coupled with each other such that the mutual inductance of each resonator system is positive in relation to its neighboring resonator systems. The positive coupling causes local $B_1$-fields of adjacent resonator systems to be essentially aligned in parallel. The inventive NMR probehead is thus constituted by the coupling network to generate a coupled mode (toroidal mode), in which all N resonator systems can be coupled together and tuned together. The coupling network operates the same coupled mode during transmission and reception.

In an especially preferred embodiment of the inventive NMR probehead, the N basic elements are disposed in a ring, in particular, in a circular ring. The measurement samples are preferably located at the same radius with respect to a center of the probehead. This makes it easier to set a homogeneous $B_1$-field that is identical in each resonator system of the ring.

A preferred further embodiment is characterized in that the NMR probehead is constituted is such a way as to generate a toroidal mode in which a common, ring-shaped closed $B_1$ magnetic field line runs through all N measurement samples. Such a probehead including a $B_1$-field is shown in FIG. 7a. In this embodiment, an especially large space with a homogeneous $B_1$-field is available for measurement samples, enabling especially good SNR values to be achieved.

In an alternative further embodiment, the NMR probehead is constituted in such a way as to generate an N-tupole mode, in which a common, ring-shaped closed $B_1$ magnetic field line runs through each pair of adjacent measurement samples. Such a probehead with $B_1$ magnetic field lines is shown in FIG. 7b.

In another, advantageous embodiment of the inventive NMR probehead, a lock coil is disposed at the center of the ring-shaped configuration of basic elements. The lock coil can be operated independently of the resonator systems (of the coupled mode). With the separate lock coil, it is possible to dispense with the more expensive deuteration or fluorination of solvents in the measurement samples.

In a most especially preferred embodiment of the inventive NMR probehead, a substance to be measured is divided into the N cylindrical measurement samples. The available quantity of a substance to be measured is distributed among the measurement samples (typically evenly); each measurement sample contains a part of the identical substance to be measured. Due to the simultaneous measurement of the measurement samples in the NMR probehead, an improved signal-to-noise ratio (SNR) is achieved.

In a further preferred embodiment, the N resonator systems are constituted as saddle coils, in particular the N resonator systems are constituted as Alderman-Grant resonators or as birdcage resonators. On saddle coils, the electric conductors are disposed on the lateral surface of a circular cylinder. Saddle coils permit filling with cylindrical measurement samples that are parallel with the static magnetic field $B_0$ and also have a relatively high filling factor, because all conductors can be disposed in the immediate vicinity of the measurement sample.

In a preferred further embodiment of this embodiment, the NMR probehead has a circular ring-shaped configuration of saddle coils, wherein one measurement sample is disposed inside each saddle coil and the conductor turns of each individual saddle coil face the two adjacent saddle coils. This configuration allows the constitution of a toroidal mode with ring-shaped closed $B_1$ magnetic field lines through all measurement samples. Such an NMR probehead is shown in FIG. 3d.

In another embodiment of the inventive NMR probehead, the N resonator systems are constituted as planar Helmholz coils or as planar resonators. In this embodiment, the electrical conductors are disposed on (one or two) flat substrate boards. This is especially easy to manufacture and especially robust. This embodiment is preferred, in particular, when high-temperature superconducting materials (HTS) are used because HTS with good material parameters can currently only be manufactured on certain planar substrates. The planar configuration also simplifies processing using lithographic techniques where the majority of high-precision lithographic processes is only available for planar substrates. This applies, in particular, to coating, contact lithography and ion etching.

In a preferred further embodiment of this embodiment, the NMR probehead comprises a circular-ring-shaped configuration of planar Helmholz coils, wherein one measurement sample is disposed in the interior of each planar Helmholz coil and the planar Helmholz coils with their flat substrate boards are radially disposed. In this case, $N \geq 8$ preferably applies. Such an NMR probehead is shown in FIG. 4b. This is a simple way of forming a toroidal mode with good homogeneity.

In an alternative variation of the above embodiment, the NMR probehead comprises a circular-ring-shaped configuration of planar resonators, wherein a measurement sample is disposed between each pair of consecutive planar resonators and the planar resonators are aligned radially. Preferably, $N \geq 8$ also applies in this case. Such an NMR probehead is shown in FIG. 5a and also in FIG. 5b. This is a simple way of producing a toroidal mode with a good filling factor.

In a further, advantageous embodiment, the N resonator systems have conductor paths made of high-temperature superconductors. This results in a higher electrical quality factor Q, i.e. a lower noise contribution from the resonator system, and therefore better SNR.

An embodiment is also preferred in which, for the number N of basic elements, the following applies: $N \geq 6$, preferably $N \geq 8$, and especially preferably $N \geq 12$. With more basic elements, it is usually possible to achieve a better filling factor of the coupled mode.

An embodiment of an inventive NMR probehead is also preferred in which the probehead has at least one additional resonator complex for a further measurement frequency, in particular, in which the additional resonator complex is constituted as a saddle coil, inside which the N basic elements are disposed. With the additional resonator complex and its further measurement frequency (the first measurement frequency belongs to the coupled mode), the probehead becomes a multi-resonance probehead, with which multiple nuclei can be measured simultaneously in orthogonal modes. A combination of four, five, or six of the following nuclei is especially preferred: $^1H$, $^2H$, $^{13}C$, $^{15}N$, $^{19}F$, $^{29}Si$, $^{31}P$.

Further advantages of the invention can be derived from the description and the drawings. The features stated above and below can also be used singly or in any combination. The embodiments shown and described are not an exhaustive account but are provided as examples to explain the invention.

The invention is shown in the drawing and is explained in more detail using examples. The figures show:

BRIEF DESCRIPTION OF THE DRAWING

FIG. 1a-1c schematic representations of basic elements with measurement sample and resonator system of types saddle coil a), planar Helmholz coil b), and planar resonator c), for inventive NMR probeheads;

FIG. 2a a schematic representation of a combination of two basic elements of the planar Helmholz coil type;

FIG. 2b a schematic representation of a combination of two basic elements of the type planar resonator and a basic element of the planar Helmholz coil type;

FIG. 6a a schematic representation of a $B_1$-field profile of an insulated basic element of the planar Helmholz coil type;

FIG. 6b a schematic representation of a $B_1$-field profile of a basic element of the planar Helmholz coil type inside the NMR probehead of FIG. 4b;

DESCRIPTION OF THE PREFERRED EMBODIMENT

Figures 3A, 3B, 3C:
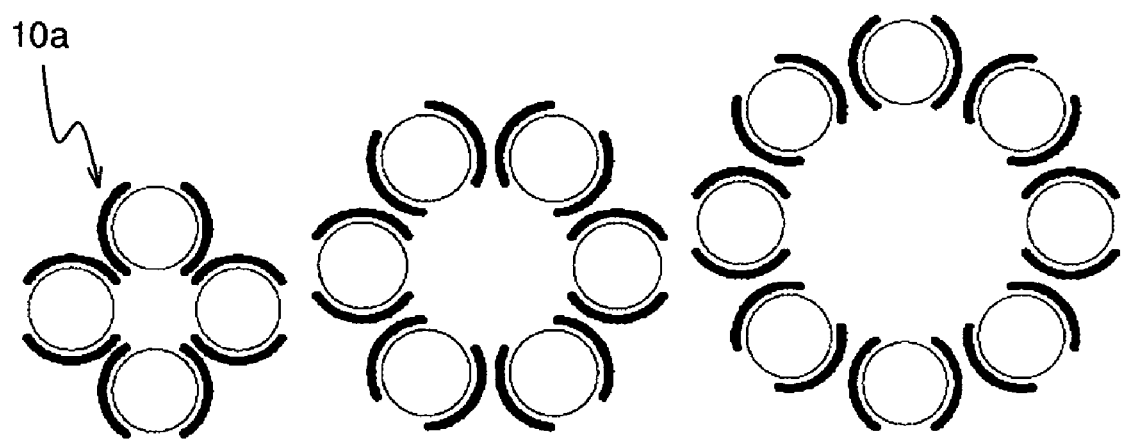
FIG. 3a-3d schematic representations of inventive NMR probeheads with basic elements of the saddle coil type disposed in a ring.
Figure 3D:
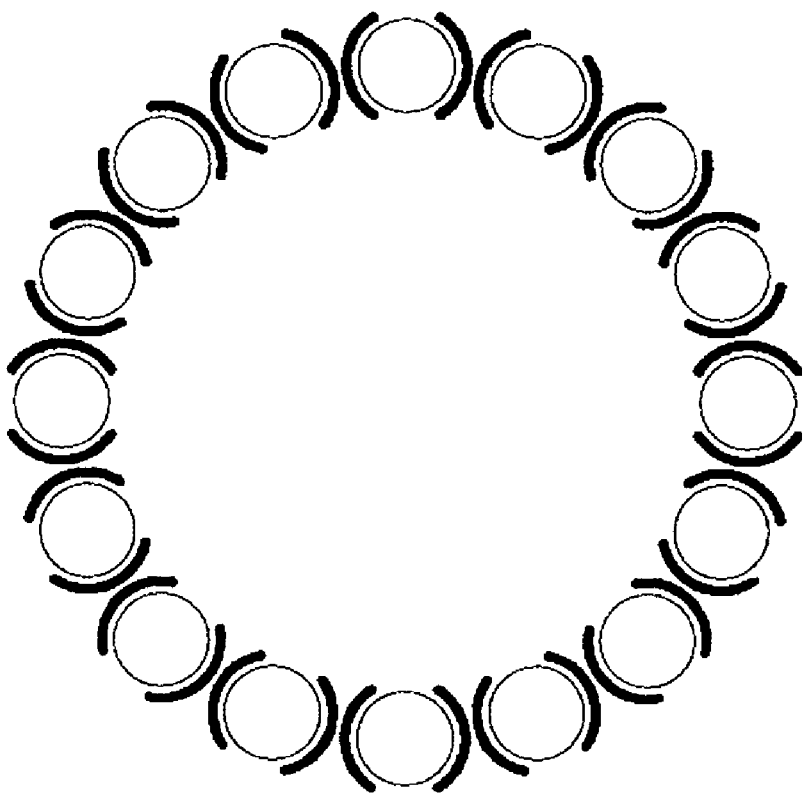

The drawings of the basic elements and probeheads show cross-sectional views.

The invention relates to a nuclear magnetic resonance (NMR) probehead, in particular with a toroidal coil or of a toroid resonator, to achieve a better signal-to-noise ratio for NMR measurements of lossy samples, in particular, in high-resolution NMR spectroscopy.

One "problem" of high-resolution NMR is the use of liquid measurement samples. These are filled into sample tubes that have to be placed vertically (with respect to gravity) into the measuring apparatus. Because the constraints of manufacturing (superconducting) high-field magnets make it technically very complicated and therefore much more expensive to make a bore at right angles to the static magnetic field, the measurement sample is usually introduced parallel to the static magnetic field (that defines the z-direction) and the coil used is a saddle coil instead of the more efficient solenoid coil. Because of the mechanical configuration, solenoid coils in high-resolution NMR are used almost exclusively in flow-through operation, in which the substance to be measured is forced through a capillary into the permanently (horizontally) mounted flow cell (see US 2005253587).

A solenoid coil is about twice as efficient as a saddle coil; a toroid is almost five times more efficient. The advantage of an ideal toroid is that the entire magnetic field energy is constrained inside the resonator and therefore in the measurement volume. The filling factor is therefore 1. With a solenoid coil, a filling factor of approx. 0.4 to 0.5 is attained depending on the length; with a saddle coil the filling factor is usually under 0.2. Toroid cavity resonators for NMR measurements in pressure cells or for imaging are known from U.S. Pat. No. 5,045,793, U.S. Pat. No. 6,788,064, U.S. Pat. No. 5,574,370, and "Comnuting the B1 field of the toroidal MRI coil" Butterworth and Gore, J. Magn. Reson. 175, 114-123 (2005).

One requirement of high-resolution NMR is to adjust the static field $B_0$ to be so homogeneous that spectral line broadening is smaller than the natural line widths due to inhomogeneities. As these can be below one Hertz, the homogeneity of the static field must be better than $10^{-9}$. The process of adjusting the homogeneity using compensating shim coils is termed "shimming".

The requirements for field homogeneity are so high that even the low paramagnetism or diamagnetism of "non-magnetic" substances, such as solvents, glass, but also copper or aluminum results in field disturbances that have to be compensated for. This can be partly solved by using material with a magnetic susceptibility of zero. If the susceptibility cannot be reduced to zero by compensation, as is the case, for example, with the measurement sample, the demagnetization field must be "shimmed" using shim coils. However, this can only succeed for generalized ellipsoids, i.e. if the measurement sample is a sphere, an ellipsoid, an infinitely long cylinder, or an infinitely long, arbitrarily thin plane. In this context, infinitely long means much longer than the $B_1$-field profile of the detection coil.

For the saddle coil, the measurement sample is a cylinder that is "infinitely long" in the z-direction; for the solenoid coil, in the x-direction (where x is the direction of the RF field).

The problem of a toroid resonator, however, is that the measurement sample is also toroidal and cannot therefore be longer then the RF field in any direction. Thus the inhomogeneities of the static field arising due to demagnetization field are not compensated for. From U.S. Pat. No. 6,788,064, it is known how the disturbances at the outer end of a toroidal cavity resonator can be brought under control even if the susceptibility of the resonator material is not compensated for. The instructions that U.S. Pat. No. 6,788,064 gives for compensation of the disturbances at the ends of the measurement sample are to eliminate part of the (active) volume of the measurement sample using susceptibility-matching plugs, i.e. only to fill the resonator partially. This drastically diminishes any advantages of cavity resonators with respect to the signal-to-noise ratio. Moreover, the cavity resonator of U.S. Pat. No. 6,788,064, has to be disassembled to replace the measurement sample, unless it is operated in flow-through operation using inlet and outlet capillaries.

A further problem of saddle and solenoid coils arises if the measurement samples are lossy. The RF losses of the measurement sample result in an electrical conductivity a (e.g. through dissolved salts, acids, or bases) of the measurement samples or in a loss tangent tan δ (dielectric losses) of the solvent (e.g. by excitation of rotation or vibration bands of the molecules). The loss tangent is, in particular, very high for polar solvents and increases with the frequency to the power of four in the relevant frequency range 100 MHz to 1 GHz.

One solution to this problem is disclosed in U.S. Pat. No. 7,068,034 and U.S. Pat. No. 6,917,201, whereby the length a of the measurement sample with reference to the x-direction, i.e. the direction of the RF field is enlarged and the width b (i.e. the y-direction) is reduced. An ideal resonator system exhibits magnetic symmetry with respect to the xz-plane so that the electric field in this plane is identical to 0. It largely increases linearly in the y-direction (where $E(y)=-E(-y)$), so that the losses ($\sim\sigma E^2$) increase quadratically. In the limiting case, in which the losses of the measurement sample dominate in the total losses, this results in an increase in the signal-to-noise ratio by a factor $\sqrt{(a/b)}$ with reference to a circular-cylindrical measurement sample.

US 2004164738, WO 00 50924, U.S. Pat. No. 4,654,592, U.S. Pat. No. 6,456,072, US 2005253587, and US 2006164088 disclose an NMR probehead in which a plurality of measurement samples have already been placed in a separate detection coil. The aim in this case is to reduce the time lost placing a measurement sample in the probehead, by inserting multiple measurement samples at the same time. The time referred to here covers insertion and shimming (field homogenization), locking (field stabilization), and temperature control.

The invention described in the section below shows a way of drastically increasing the signal-to-noise ratio, in particular, in the case of lossy measurement samples in high-resolution NMR, by dividing the substance to be measured into multiple measurement samples.

In an analogous way to the saddle coil, a toroidal coil or a toroid resonator can be constituted such that openings remain in the z-direction above and below for the insertion of the measurement samples in the z-direction.

In this case, a number N of measurement samples are arranged in a ring, and a ring-shaped $B_1$-field is excited with HTS resonators, for example. In the case of a cryogenically cooled probehead, each measurement sample must be temperature controlled. This can be performed either singly or by means of a common central tube.

If a substance to be measured is divided into N measurement samples and measured with N non-coupled resonator systems, this is equivalent to N single measurements with a single measurement sample. Therefore a gain in the signal-to-noise ratio of $\sqrt{N}$ is achieved with reference to a single measurement tube. This is usually considerably lower than if the entire quantity of substance were measured in one measurement sample, because the noise from N resonators is higher than the noise from a single, large resonator.

However, there are situations in which a considerable increase in performance can be achieved, if the substance to be measured is divided into smaller measurement samples. This is, in particular, the case if the measurement samples are lossy. If the losses of the measurement samples dominate the total losses, exactly the same signal-to-noise ratio is achieved for the same length in the z-direction with cylindrical measurement samples of any diameter. In this situation, an increase of the signal-to-noise ratio of 4N can be achieved.

In other words, one can achieve a length to width ratio of N as if a rectangular measurement sample with length $a = N * b$ had been used, as suggested in U.S. Pat. No. 7,068,034 and U.S. Pat. No. 6,917,201.

Moreover, it is usually possible to improve the ratio of active to passive volume if the measurement samples are smaller. This is because the B1-field profile is falling off steeper, the smaller the diameter of the coil. And, with a steeper profile, the passive volume can also be reduced, as its only function is to ensure the shimmability of the filled probehead. Furthermore, the magnetic disturbance at the end of the measurement sample is smaller in absolute terms due to the lower mass, so that this end can be drawn closer to the edge of the $B_1$-field.

The inventive probehead comprises N basic elements, wherein each basic element exhibits one measurement sample (or one probehead position) and one (possibly multiple-part) resonator system. A basic element or the associated resonator system can be constituted as follows:

a) saddle coil, b) planar Helmholz coil, c) planar resonator. Other variants of resonator systems (or coils systems) are also possible.

FIGS. 1a, 1b, 1c each show a cross-section of one basic element 10a, 10b, 10c, each with one (round in this case) measurement sample 11 and each with one resonator system 12a (saddle coil with conductor turns 13 above and below drawn in bold lines), 12b (planar Helmholz coil, comprising two boards 14 facing each other with conductors 15), 12c (planar resonator, comprising one board 14 and conductor 15).

If multiple resonator systems are now combined to form a common mode, it is also possible to gain more than the 4N of the uncoupled basic elements because the proportion of the magnetic energy in the measurement volume can be increased with respect to the total energy. However, there are situations in which the filling factor is impaired by the coupling. This is the case if, due to the coupling, volume elements with a high field strength are produced that are not filled with substance to be measured. An obvious example of this is a combination of two basic elements b), in which the distance between the basic elements is approximately the same as the distance between the two planar resonators, cf. FIG. 2a with the two spaced basic elements 10b. In this case, the coupled system is only approx. ⅔ full because it is actually equivalent to a combination of two basic elements of type c) and one basic element of type b) with a total of three measurement samples, cf. FIG. 2b with the basic elements 10c outside (dashed border) and the basic element 10b inside.

To achieve the highest possible filling factor, it is therefore unavoidable to choose a combination of resonators that permits the greatest possible filling with measurement samples. It may also be desirable to adapt the shape of the measurement samples and choose, for example, rectangular samples or samples in the shape of toroidal segments. It is additionally possible to use common methods for extending the measurement samples outside the active range of the resonator by means of susceptibility-matching plugs to further reduce the lost sample volume.

Figure 3E:
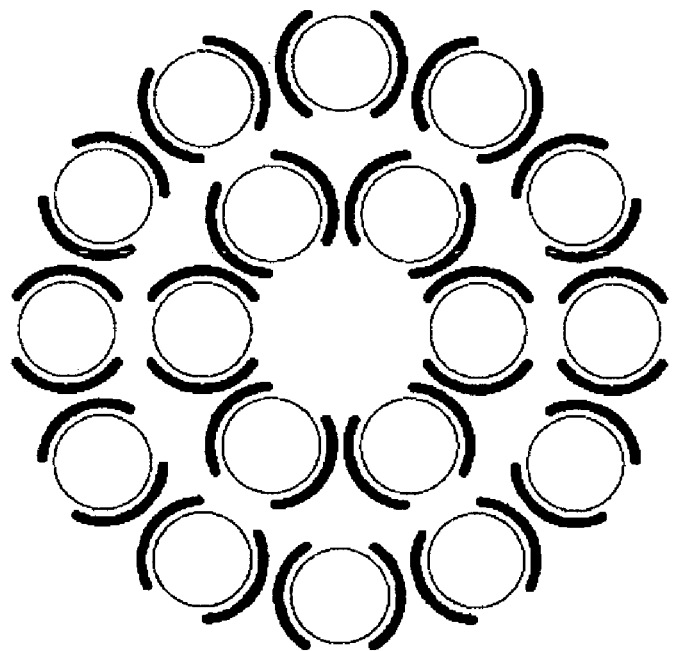
FIG. 3e a schematic representation of an inventive NMR probehead with two nested rings of basic elements of saddle coil type.

FIGS. 3a to 3e show some possible combinations of basic elements a) as NMR probeheads, in which either four (FIG. 3a), six (FIG. 3b), eight (FIG. 3c) or sixteen (FIG. 3d) resonator systems (saddle coils) are combined to form a toroid, or two toroids with six or twelve nested basic elements (FIG. 3e). The conductor turns of adjacent basic elements 10a of the toroids are facing each other in the examples shown. An even number N of elements can simplify shimming. An odd number N of elements can simplify spatial resolution by means of gradient coding.

The second and third basic element, i.e. types b) and c), are relevant, in particular, for cryogenically cooled probeheads with resonator systems made of high-temperature superconductors. Such probeheads require that the measurement sample be thermally isolated from the resonator system. This impairs the filling factor of the resonator systems but this is more than compensated for by lowering the noise due to reduced in resistance and temperature of the resonator systems.

Figures 4A, 4B:
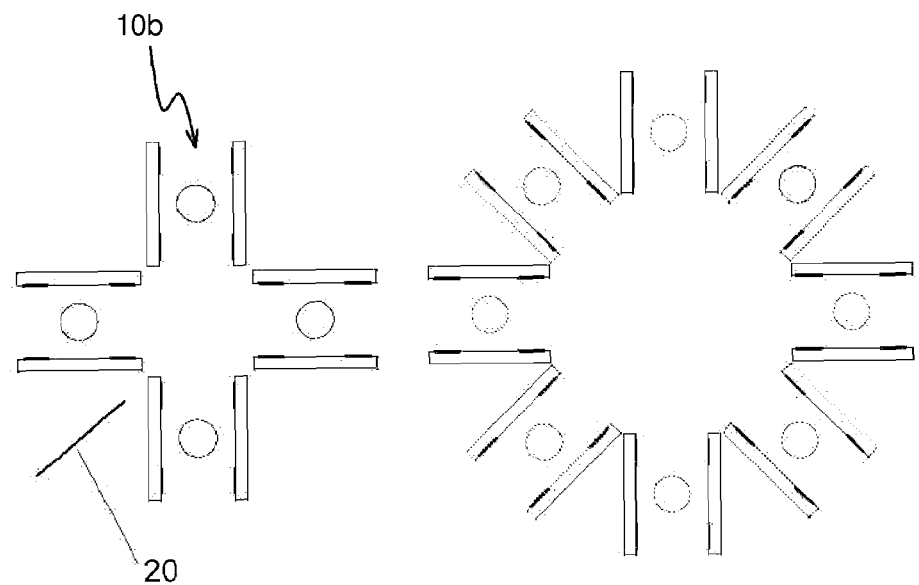
FIG. 4a-4b schematic representations of inventive NMR probeheads with basic elements of the planar Helmholz coil type, disposed in a ring.

Combinations for probeheads of the second basic element, i.e. type b), are shown in FIGS. 4a and 4b. The examples shown comprise four (FIG. 4a) and eight (FIG. 4b) basic elements 10b.

It is evident that, in particular, for a small number of basic elements this combination is less than optimal because the filling of the toroidal mode with measurement samples is very poor. For example, in FIG. 4a, four very large regions between the basic elements 10b, that is top left, top right, bottom left, and bottom right, are produced, in which a high $B_1$-field is generated but no measurement sample has been placed. However, the larger the number of basic elements, the lower the proportion of these unused regions. FIG. 4a also schematically indicates a coupling network 20 for coupling the resonator systems of the basic elements to each other. The coupling network 20 has one common receiver circuit for the totality of resonator systems.

The high homogeneity of the $B_1$-field that is achieved in the region of the measurement sample is advantageous in the configuration of basic elements of type b). Moreover, the design of such a probehead is simpler.

Figures 5A, 5B:
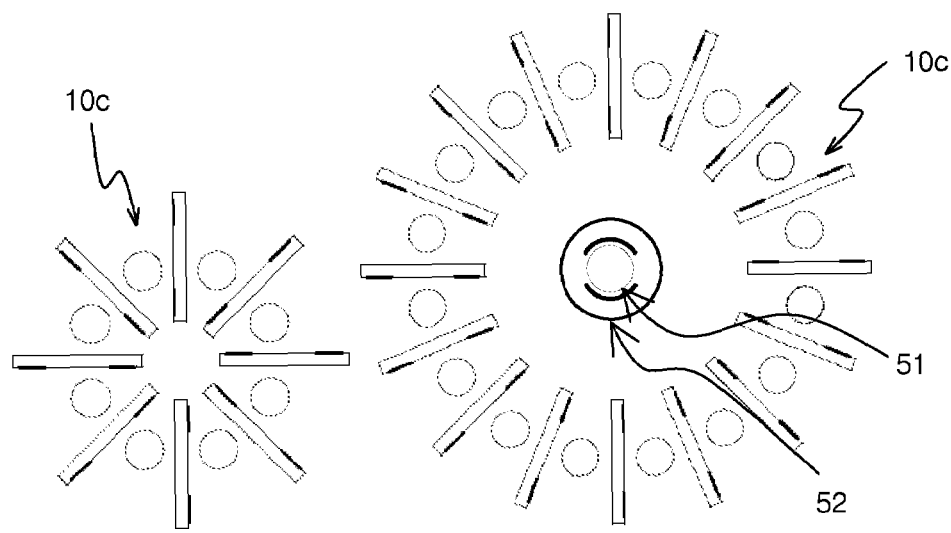
FIG. 5a-5b schematic representations of inventive NMR probeheads with basic elements of the planar resonator type, disposed in a ring.

FIGS. 5a and 5b show more efficient configurations of planar resonator systems, equivalent to type c), for a probehead for eight (FIG. 5a) and sixteen (FIG. 5b) basic elements 10c or measurement samples.

An inventive probehead has several advantages:

1. The efficiency increases dramatically. A completely filled, perfect toroid has a (maximum possible) filling factor η of 1. By comparison, the filling factor for the solenoid is approx. 0.5 and for the saddle coil/birdcage, approx. 0.2. This is an improvement potential of a factor of five over the common coil configurations in NMR. An inventive resonator complex, which is operated in toroidal mode, cannot be completely filled. However, if sufficient basic elements are used, an improvement in the filling factor of a factor of two can be achieved. By using non-cylindrical measurement samples, for example, with a square or rectangular cross-section, the filling factor of an inventive probehead can be even further increased.

2. Shielding in the z-direction is not necessary because no (or scarcely any) field is generated in the outer space. Normally, such shielding is necessary to limit the $B_1$-field to a desired volume. If such shielding is not provided, experiments with solvent suppression and achievement of natural line widths are only possible with great difficulty.

FIG. 6a shows the absolute value of the NMR-active $B_1$-field component of the RF field along the cylinder axis of the measurement samples for a typical basic element of the type b). It can be seen that in the outer area backflow 61 of the field results in an inefficient extension of the measurement area. If such a probehead is used, these outer areas must be shielded. This results in additional losses in quality and efficiency and complicates the experimental set-up.

FIG. 6b shows the field profile for a probehead according to FIG. 4b with sixteen basic elements of the type c). It is clear that the field is limited to the desired "active" volume without additional shielding. This also increases the filling factor and therefore the achievable signal-to-noise ratio. Furthermore, any shielding can be positioned such that the electric and/or magnetic field of additional resonators fulfills certain requirements. If the probehead is operated with more than one resonator complex, there is a free choice of positioning of the shielding for at least one second resonator complex. This can, for example, be chosen such that the $B_1$-field profiles of the toroidal mode and of the second resonator complex are as similar as possible or that only the field properties of the additional resonator complex are optimized.

3. The RF losses in lossy measurement samples approximately correspond to the N-tuple of the losses of a measurement sample with a small diameter. With 16 measurement samples, an aspect ratio of more than 16:1 and the potential for a four-fold increase in SNR over the same volume in a single round sample is generated, at least if the losses in the measurement sample dominate in the signal-to-noise ratio.

Figure 7A:
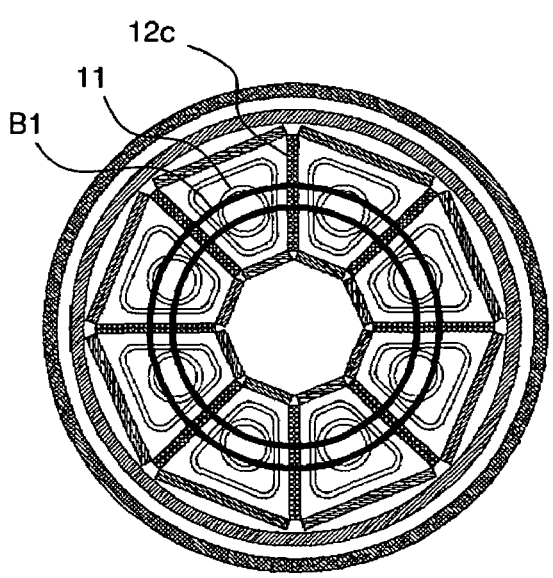
FIG. 7a-7d schematic representations of $B_1$ magnetic field lines of various orthogonal modes of an inventive NMR probehead with multiple resonator complexes for the various modes and associated resonance frequencies.
Figure 7B:
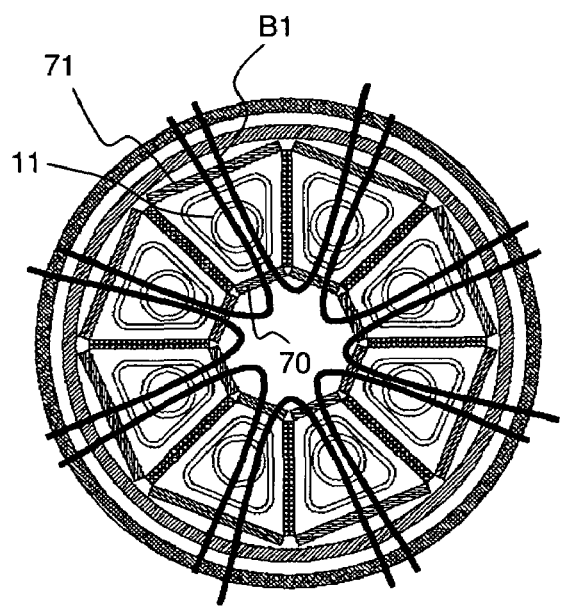
Figure 7C:
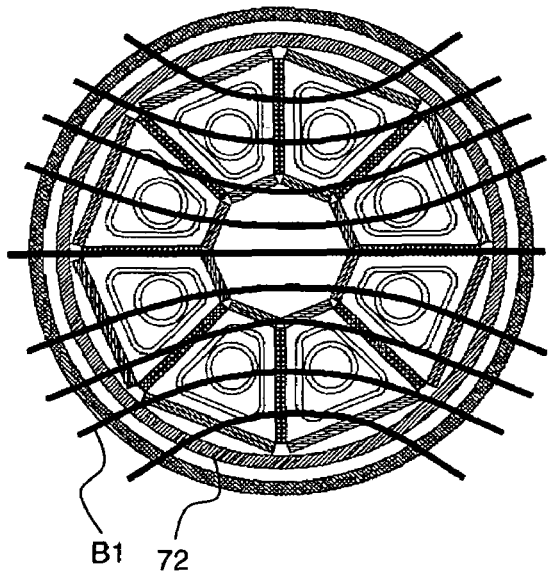
Figure 7D:
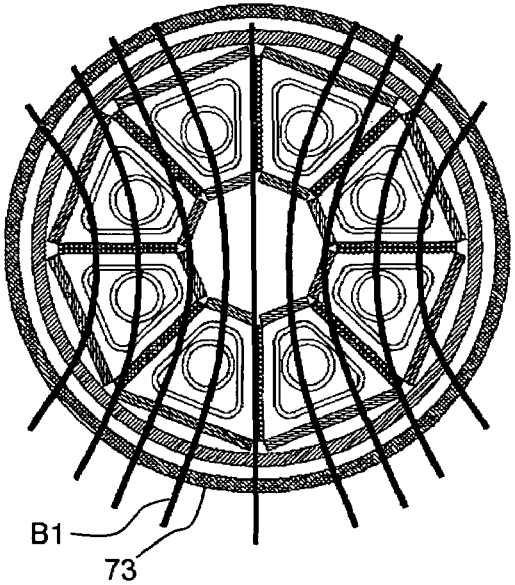

4. By using the toroidal mode for the detection frequency (usually protons or fluorine), not only the linear but also the N-tupole mode are available independently. In this way, in the case of a triple resonance probehead, four completely independent resonator complexes can be operated and all nuclei tuned singly. FIG. 7a shows the proton mode (a toroidal mode) of a triple resonance probehead (generated by radially aligned planar resonators 12c; some field lines of the $B_1$-field pass through all measurement samples 11) in a closed ring shape, in FIG. 7b the associated $^{13}$C mode as an octupole mode (generated by inner and outer resonators aligned perpendicularly to the radius 70, 71; some $B_1$ magnetic field lines each run through common adjacent measurement samples 11). The two FIGS. 7c and 7d show the two further orthogonal modes that can be used, for example, for $^{15}$N and $^2$H (each generated by outer, ring-shaped resonators 72 and 73, also called linear coils).

The diameters of the linear coils are clearly larger than on a conventional probehead with two detection coils and a single measurement sample, but the efficiency increases because only a single measurement frequency has to be tuned on one coil. For the additional linear coils, it is most expedient to use birdcages or Alderman-Grant resonators. Moreover, using a network on the linear coils, another nucleus can be coupled, resulting in a penta-resonance probehead.

Because the modes are orthogonal, a probehead can also be built in which the toroid and the octupole coil (or their single resonators 12c, 70, 71) are made of HTS, while the linear coils 72, 73 are normally conducting. The couplings expected due to imperfections are so low that damping of the HTS resonator systems need not to be feared.

In high-resolution NMR, in particular high-field NMR, with proton frequencies between 400 MHz and 1 GHz, it is standard practice to use measurement samples with a 5 mm outer diameter and to fill them to between 40 and 60 mm high. Due to the wall thickness of the sample tube and the filling height, the probe volume is in the range approx. 550-900 µl. The table below shows how many measurement samples are required to fill 600 µl of substance to be measured into the corresponding measurement samples (OD: outer diameter; ID: inner diameter).

| OD in mm | ID in mm | Filling level in mm | Volume in µl | # Sample | Comment |
|---|---|---|---|---|---|
| 1 | 0.8 | 25 | 12.5 | 48 | |
| 1.7 | 1.3 | 28 | 37 | 16 | |
| 1.9 | 1.5 | 34 | 60 | 10 | |
| 2 | 1.6 | 38 | 75 | 8 | |
| 2.5 | 2.2 | 40 | 150 | 4 | |
| 3 | 2.42 | 40 | 185 | 3 | |
| 4 | 3.24 | 40 | 330 | 2 | |
| 5 | 4.24 | 40 | 565 | 1 | thin-walled |
| 5 | 4.52 | 40 | 640 | 1 | ultra thin-walled |

Figure 8A:
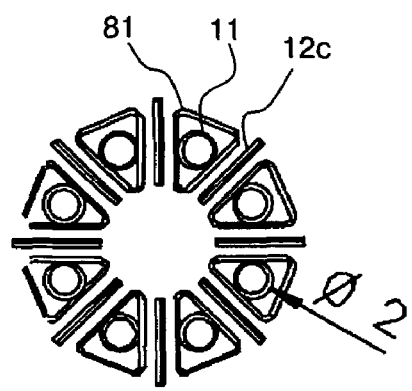
FIG. 8a-8b schematic representations of coil geometries in an inventive NMR probehead.
Figure 8B:
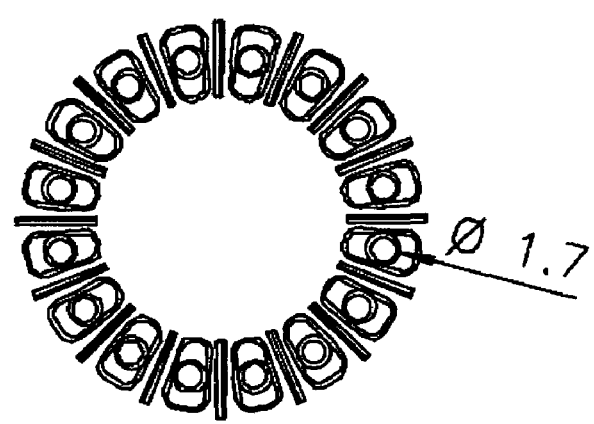

A probehead with eight 2 mm, sixteen 1.7 mm or forty-eight 1 mm measurement samples would have approximately the same sample volume as a conventional probehead for 5 mm measurement samples. The coil geometry and one central tube per measurement sample for the purpose of thermal insulation are shown in FIGS. 5a and 8b for the cases of the 2 mm (FIG. 8a) and 1.7 mm (FIG. 8b) measurement samples, with measurement samples 11, central tubes 81 and planar resonators 12c. The central tube does not have to use the entire free space but can also be cylindrical like the measurement samples. However, it is expedient for the shape of the central tube to be matched to the available space. The central tube is used for thermal insulation between the warm measurement sample and the cold detection coil: inside the central tube, temperatures of about 300 K prevail (close to room temperature), the planar resonator systems are cooled to cryogen temperatures below 80 K, or preferably to below 25 K. Alternatively, all warm regions can be interconnected. This can simplify the construction and/or thermalization of the measurement samples.

If sufficient quantity of the substance to be measured is not available, such a probehead can also only partially be filled. In this case, the filling factor is lost, but the versatility of the probehead is clearly better than with a conventional probehead. In a probehead for 5 mm sample tubes, an insufficient quantity of substance to be measured requires that either the measurement sample be diluted or the diameter of the measurement samples be reduced. If different diameters are used, not only different sample tubes but also the matching holders, etc. have to be procured, which usually limits the choice of usable volumes to two or three at the most. Extreme dilution can also result in problems with respect to the purity of the solvent with reference to the concentration of the substance to be measured.

If the configuration of the basic elements is ring-shaped, this leaves free space at its center. This can be used to accommodate a separate lock coil ("external lock"), cf. the example in FIG. 5b, with basic elements 10c and lock coil 51. To avoid coupling between the lock coil and the surrounding resonator complexes, the lock coil can be shielded by means of shield 52.

Usually in high-resolution NMR, the solvent is partly or completely deuterated or fluorinated and the NMR signal is traced by means of a transmission and reception system. This signal contains both information about the strength of the static magnetic field $B_0$ and about its homogeneity.

Shim coils are controlled by an automatic closed-loop control in such a way that the requirements for field stability and field homogeneity are met.

A separate lock coil has the advantage that the solvent of the measurement samples no longer has to be deuterated/fluorinated. This results in big financial savings for the user because these solvents are very expensive and, in this embodiment, locking can be performed with the same measurement sample for all measurements.

There are also important NMR experiments, e.g. for protein analyses, in which the SNR can be increased if no deuterated solvents are used. This applies, in particular, to all amide-proton-detected experiments (such as HSQC), which are among the most important in the structure analysis of proteins. Because the amide protons usually exchange $H_2O$/$D_2O$ with the protons of the surrounding solvent, they are reduced according to the $D_2O$ concentration. This can result in an increase in SNR by 11% if, instead of 90% $H_2O$/10% $D_2O$, pure $H_2O$ can be used.

A further alternative is to replace the solvent with deuterated/fluorinated solvent in only one of the N measurement samples or to use solvent only. In this way, it can be decided on a case-by-case basis whether or not the substance to be measured is to be dissolved in normal solvent.

If an external lock is used, the field homogeneity can still be determined and corrected using proton-detected imaging methods of the static magnetic field $B_0$.

U.S. Pat. No. 5,574,370 discloses a "toroid cavity resonator" that can be filled with numerous measurement samples. The difference from the invention presented here is the type of resonator. During operation, a standing wave builds up in a cavity resonator like that of U.S. Pat. No. 5,574,370. In the excited TM mode, the field amplitude exhibits a 1/r dependency in the radial direction (see FIG. 9a). Such a field distribution is completely inadequate for the requirements of high-resolution NMR because the homogeneity of the $B_1$-field component of the RF field is markedly too poor. If the resonator is only partially filled, the homogeneity of the $B_1$-field among the measurement samples can be improved, but the filling factor drops drastically and the efficiency of the resonator is insufficient. The sensitivity of the cavity resonator is greatest where the homogeneity is lowest, i.e. in the vicinity of the interior conductor. U.S. Pat. No. 5,574,370, this inhomogeneity is used to excite the different measurement samples, with which the resonator is filled, separately (p.2-1.20ff.) to be able to dispense with the gradient coding for spatial resolution.

However, in the presented invention, the aim is to achieve not only increased efficiency and low dependency on losses in the measurement sample, but also the most homogeneous possible field distribution across the measurement samples. This is necessary to achieve the same sensitivity across the entire volume of all measurement samples not only for a simple read pulse but also in the case of multi-dimensional pulse sequences with numerous pulses. Unlike the cavity resonator, the inventive probehead has the greatest sensitivity where the homogeneity is greatest (see FIG. 9b). Reduced homogeneity results in drastic signal losses, in particular, in the case of inversion pulses, so that a 1/r dependency of the $B_1$-field across the measurement volume, as in the case of a cavity resonator according to U.S. Pat. No. 5,574,370, is unacceptable for the requirements of high-resolution NMR.

Figure 9A:
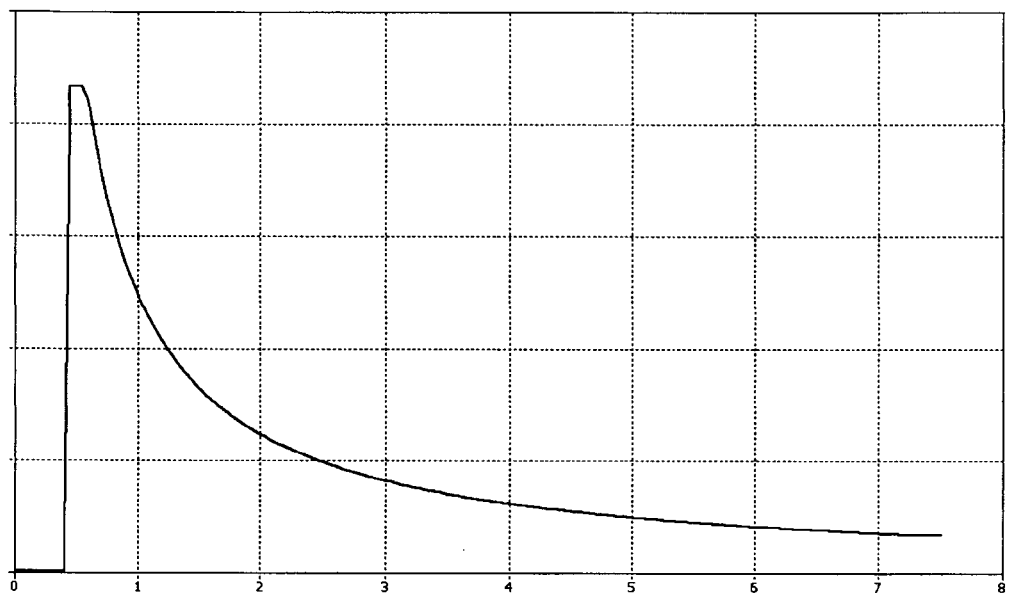
FIG. 9a a schematic representation of the radial field profile at the center of a cavity resonator according to [4]
Figure 9B:
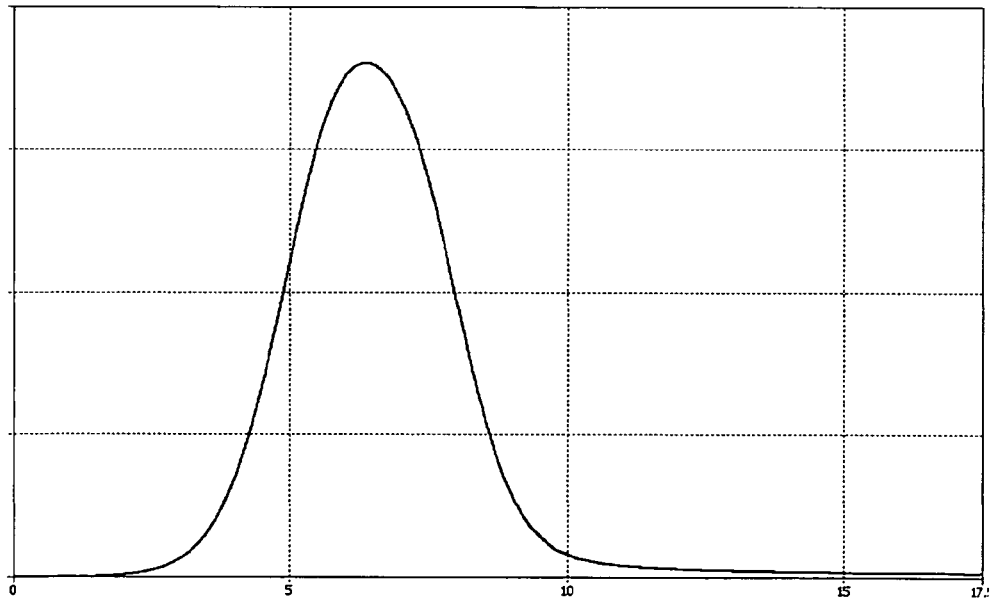
FIG. 9b a schematic representation of the radial field profile at the center of resonator complex according to FIG. 4b.

FIGS. 9a and 9b show the radial field profile at the center of the resonator: FIG. 9a for a cavity resonator according to U.S. Pat. No. 5,574,370, in which the measurement samples are placed at various positions in the range approx. 1 mm to 7 mm, and FIG. 9b for the inventive resonator according to FIG. 4b, in which all measurement samples are mounted at approx. 6.75 mm.

Moreover, the resonance frequency of a cavity resonator only depends on its geometry and the dielectric constant of the filling. Slight adaptations can be made between the inner conductor and the outer shell or metallic and dielectric plugs.

However, high-resolution NMR probeheads normally have three or more channels. These additional channels cannot be coupled when cavity resonators are used as in U.S. Pat. No. 5,574,370 because this limits the magnetic field to its interior (p. 2 I. 36-37). Moreover, such a resonator is impermeable to external RF fields. This is considered an advantage for the use of U.S. Pat. No. 5,574,370, but is useless for the construction of a multi-channel probehead.

US 2004164738, WO 00 50924, U.S. Pat. No. 4,654,592, U.S. Pat. No. 6,456,072, US 2005253587, and US 2006164088 disclose NMR measurement systems that use numerous detection systems to be able to perform concurrent or rapidly sequenced spectroscopy with numerous measurement samples. In this case, the individual detection coils should, if possible, not couple with each other because otherwise the spectrum information of the various measurement samples could not be gathered separately. Moreover, each of the multiple detection systems is coupled, tuned, and matched separately and the information is processed separately in the spectrometer.

U.S. Pat. No. 6,456,072 describes a system in which the transmission and reception coils are numerous, but the spectrometer is switched between these coils with a selection switch.

US 2005253587 and US 2006164088 each describe a system in which multiple flow cells with the associated detection coils are installed in the probehead.

U.S. Pat. No. 4,654,592 also describes a system in which it is possible to measure with a single conventional detection device but this is used only in conjunction with measurement samples that occupy different spectral ranges ("samples of disparate character"). In this case, the measurement samples are positioned one above the other in the z-direction. FIG. 6 in the reference document depicts a configuration in which the measurement samples are not positioned axially one above the other but side by side.

Differences from the invention presented here include, in particular, the following points:

According to the invention, the same substance to be measured is distributed across the different measurement samples; it is not the case that different substances to be measured are used in the different measurement samples.

Moreover, the resonator systems that surround the individual measurement samples couple so strongly to each other that a coupled mode ("toroidal mode") results. This mode is only coupled once and all resonator systems are tuned together. The spectroscopic information from the individual measurement samples cannot be assigned locally. If different measurement samples were used, their signals would overlap and analysis would no longer be possible.

In summary, the invention describes an NMR probehead, in which multiple basic elements each with a measurement sample and a resonator system (that is, a single-part or multiple-part resonator) are provided. These resonator systems are coupled to each other by means of appropriate geometry (positioning) and control (only one electronic coupling network, shared transmission and reception circuit) (or interconnected by electromagnetic coupling) in such way that a common mode is available for transmission and reception. This permits measurement of all measurement samples of the basic elements such as a single sample (simultaneous measurement); instead of selective information relating to the single measurement samples, only global information for all measurement samples is obtained. A single sample (substance to be measured) is divided evenly into the measurement samples; the measurement samples are therefore identical. In the coupled mode, all measurement samples are subjected to an essentially identical and homogeneous $B_1$-field. The common mode is produced preferably through positive mutual inductance of the individual resonator systems with respect to their adjacent resonator systems. The resonator systems are typically disposed in a circular ring, and the generated $B_1$-field exhibits (as does the configuration of the basic elements) a multiplicity corresponding to the number of basic elements. The probehead can, in addition to the resonator complex, which is constituted by the resonator systems of the basic elements, also comprise one or more further resonator complexes for further measurement frequencies or modes. The inventive probehead permits measurement of an available quantity of substance to be measured with an improved signal-to-noise ratio (SNR).

I claim:

1. A nuclear magnetic resonance (=NMR) probehead, the probehead comprising:
N basic elements, wherein N≧2, each basic element structured and dimensioned to accommodate a measurement sample and each basic element having a resonator system, N resonator systems of said N basic elements being coupled to each other within a coupling network, said coupling network having one common receiver circuit for a totality of said N resonator systems, wherein said totality of said N resonator systems is operated in one identical, coupled mode during transmission and reception, a substance to be measured thereby being divided into N measurement samples wherein said N basic elements and said associated N resonator systems form a resonator complex that is operated as a single unit and simultaneously readout with said common receiver circuit.

2. The NMR probehead of claim 1, wherein said N basic elements are disposed in a ring-shaped or circular fashion.

3. The NMR probehead of claim 2, further comprising a lock coil disposed at a center of a ring-shaped configuration of said basic elements.

4. The NMR probehead of claim 1, wherein said N resonator systems are constituted as saddle coils, as Alderman-Grant resonators, or as birdcage resonators.

5. The NMR probehead of claim 4, wherein the NMR probehead exhibits a circular-ring-shaped configuration of saddle coils, a measurement sample being disposed inside each saddle coil and conductor turns of each saddle coil facing two respective adjacent saddle coils.

6. The NMR probehead of claim 1, wherein said N resonator systems are constituted as planar Helmholz coils or as planar resonators.

7. The NMR probehead of claim 6, wherein the NMR probehead comprises a circular-ring-shaped configuration of planar Helmholz coils, a measurement sample being disposed inside each planar Helmholz coil and said planar Helmholz coils, with flat substrate boards thereof, are radially aligned.

8. The NMR probehead of claim 6, wherein the NMR probehead comprises a circular-ring-shaped configuration of planar resonators and a measurement sample is disposed between each pair of consecutive planar resonators, wherein said planar resonators are each radially aligned.

9. The NMR probehead of claim 6, wherein the N resonator systems have conductor paths made of high-temperature superconductors.

10. The NMR probehead of claim 1, wherein N≧6 N≧8, or N≧12.

11. The NMR probehead of claim 1, further comprising at least one additional resonator system for a further measurement frequency.

12. The NMR probehead of claim 11, wherein said additional resonator system is constituted as a saddle coil, inside which said N basic elements are disposed.

13. A nuclear magnetic resonance (=NMR) probehead, the probehead comprising:
N basic elements, wherein N≧2, each basic element structured and dimensioned to accommodate a measurement sample and each basic element having a resonator system, N resonator systems of said N basic elements being coupled to each other within a coupling network, said coupling network having one common receiver circuit for a totality of said N resonator systems, wherein said totality of said N resonator systems is operated in one identical, coupled mode during transmission and reception, said N basic elements being disposed in a ring-shaped or circular fashion, wherein the NMR probehead is constituted in such a way as to generate a toroidal mode, in which a common, ring-shaped closed $B_1$ magnetic field line runs through all N measurement samples wherein said N basic elements and said associated N resonator systems form a resonator complex that is operated as a single unit and simultaneously readout with said common receiver circuit.

14. A nuclear magnetic resonance (=NMR) probehead, the probehead comprising:

N basic elements, wherein N≧2, each basic element structured and dimensioned to accommodate a measurement sample and each basic element having a resonator system, N resonator systems of said N basic elements being coupled to each other within a coupling network, said coupling network having one common receiver circuit for a totality of said N resonator systems, wherein said totality of said N resonator systems is operated in one identical, coupled mode during transmission and reception, said N basic elements being disposed in a ring-shaped or circular fashion, wherein the NMR probehead is constituted to generate an N-tupole mode, in which a common, ring-shaped closed $B_1$ magnetic field line passes through pairs of adjacent measurement samples wherein said N basic elements and said associated N resonator systems form a resonator complex that is operated as a single unit and simultaneously readout with said common receiver circuit.

* * * * *